US 11,171,444 B2

(12) United States Patent
Andrew

(10) Patent No.: US 11,171,444 B2
(45) Date of Patent: Nov. 9, 2021

(54) APPARATUS AND METHOD FOR COUPLING THE APPARATUS TO A RECIPROCAL APPARATUS

(71) Applicant: Nokia Technologies Oy, Espoo (FI)

(72) Inventor: Piers Andrew, Cambridge (GB)

(73) Assignee: Nokia Technolgies Oy, Espoo (FI)

( * ) Notice: Subject to any disclaimer, the term of this patent is extended or adjusted under 35 U.S.C. 154(b) by 0 days.

(21) Appl. No.: 15/779,635

(22) PCT Filed: Nov. 21, 2016

(86) PCT No.: PCT/FI2016/050814
§ 371 (c)(1),
(2) Date: May 29, 2018

(87) PCT Pub. No.: WO2017/093601
PCT Pub. Date: Jun. 8, 2017

(65) Prior Publication Data
US 2018/0358742 A1     Dec. 13, 2018

(30) Foreign Application Priority Data

Dec. 3, 2015   (EP) ..................................... 15197789

(51) Int. Cl.
*H01R 13/62*     (2006.01)
*H05K 3/36*      (2006.01)
(Continued)

(52) U.S. Cl.
CPC ..... *H01R 13/6205* (2013.01); *H01R 13/2414* (2013.01); *H05K 3/323* (2013.01);
(Continued)

(58) Field of Classification Search
CPC .... H01R 13/6205; H01R 13/24; H01R 11/30; H01R 13/2421; H01R 13/7037;
(Continued)

(56) References Cited

U.S. PATENT DOCUMENTS 4,199,637 A      4/1980   Sado ............................. 428/119
5,829,987 A  *  11/1998   Fritsch ............... H01R 13/7037
                                                      439/38
(Continued)

FOREIGN PATENT DOCUMENTS

DE      202009005706 U1    7/2009
GB           2054277 A      2/1981
(Continued)

OTHER PUBLICATIONS

"Quantum Tunnelling Composite", Wikipedia, Retrieved on May 22, 2018, Webpage available at : https://en.wikipedia.org/wiki/Quantum_tunnelling_composite.
(Continued)

*Primary Examiner* — Edwin A. Leon
*Assistant Examiner* — Matthew T Dzierzynski
(74) *Attorney, Agent, or Firm* — Harrington & Smith

(57) ABSTRACT

An apparatus and method, the apparatus comprising: a layer of quantum tunnelling composite configured such that in a non-compressed state the quantum tunnelling composite is an electrical insulator and in a compressed state the layer of quantum tunnelling composite is an electrical conductor; a magnetic portion configured to cause compression of the quantum tunnelling composite; and wherein the apparatus is configured to be coupled to a reciprocal apparatus where the reciprocal apparatus comprises a reciprocal magnetic portion such that when the apparatus is coupled to the reciprocal apparatus the magnetic portion causes compression of the quantum tunnelling composite to provide a direct current path through the quantum tunnelling composite to the reciprocal apparatus.

14 Claims, 7 Drawing Sheets

Figure 1:
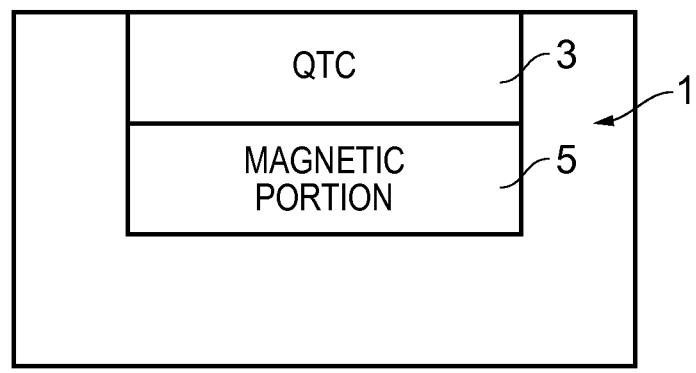

(51) Int. Cl.
*H01R 13/24* (2006.01)
*H05K 3/32* (2006.01)

(52) U.S. Cl.
CPC ............... *H05K 3/36* (2013.01); *H05K 3/361* (2013.01); *H05K 3/365* (2013.01); *H05K 2201/0314* (2013.01); *H05K 2201/083* (2013.01)

(58) Field of Classification Search
CPC ...... H01R 24/38; H01R 13/66; H01R 13/703; H01R 24/58; H01R 13/64; H01R 31/06; H01R 13/2407; H01R 2103/00; H01R 2105/00; H01R 24/20; H01R 35/04; H01R 12/714; H01R 12/79
See application file for complete search history.

(56) References Cited

U.S. PATENT DOCUMENTS

| | | | |
|---|---|---|---|
| 7,059,901 B2 | 6/2006 | Morita et al. | |
| 8,569,189 B2 | 10/2013 | Bhattacharya et al. | |
| 8,907,692 B2 | 12/2014 | Marsanne et al. | |
| 9,696,223 B2* | 7/2017 | Lisseman | G01L 1/142 |
| 2004/0263312 A1 | 12/2004 | Johnson et al. | |
| 2006/0182297 A1 | 8/2006 | Cyr et al. | |
| 2007/0177298 A1 | 8/2007 | Jaatinen et al. | |
| 2008/0306407 A1 | 12/2008 | Taylor | |

FOREIGN PATENT DOCUMENTS

| | | |
|---|---|---|
| JP | 2001148582 A | 5/2001 |
| WO | 2014/043664 A1 | 3/2014 |

OTHER PUBLICATIONS

Zaman et al., "Quantum Tunnelling Composite, a New Facilitate Sensing and Switching Technology in Textile Keypad", Textile Today, Jan. 1, 2011, pp. 24-26.
"MagSafe", Wikipedia, Retrieved on May 22, 2018, Webpage available at : https://en.wikipedia.org/wiki/MagSafe.
"Pogo Pin", Wikipedia, Retrieved on May 22, 2018, Webpage available at : https://en.wikipedia.org/wiki/Pogo_pin.
Extended European Search Report received for corresponding European Patent Application No. 15197789.9, dated Jun. 2, 2016, 8 pages.
International Search Report and Written Opinion received for corresponding Patent Cooperation Treaty Application No. PCT/FI2016/050814, dated Feb. 7, 2017, 11 pages.

* cited by examiner

APPARATUS AND METHOD FOR COUPLING THE APPARATUS TO A RECIPROCAL APPARATUS

RELATED APPLICATION

This application was originally filed as PCT Application No. PCT/FI2016/050814 filed Nov. 21, 2016 which claims priority benefit from EP Patent Application No. 15197789.9 filrf Dec. 3, 2015.

TECHNOLOGICAL FIELD

Examples of the disclosure relate to an apparatus and method for coupling the apparatus to a reciprocal apparatus. In particular, they relate to an apparatus which may be provided within an electronic device to enable the electronic device to be coupled to a connecting device where the connecting device comprises a reciprocal apparatus.

BACKGROUND

Apparatus which enable electronic devices to be coupled to a connecting device are well known. For instance electronic devices often comprise apertures which enable devices such as power cables or data connections to be received within the apertures and enable power and/or data transfer.

It is useful to improve apparatus for enabling such devices to be coupled together.

BRIEF SUMMARY

According to various, but not necessarily all, examples of the disclosure, there may be provided an apparatus comprising: a layer of quantum tunnelling composite configured such that in a non-compressed state the quantum tunnelling composite is an electrical insulator and in a compressed state the layer of quantum tunnelling composite is an electrical conductor; a magnetic portion configured to cause compression of the quantum tunnelling composite; and wherein the apparatus is configured to be coupled to a reciprocal apparatus where the reciprocal apparatus comprises a reciprocal magnetic portion such that when the apparatus is coupled to the reciprocal apparatus the magnetic portion causes compression of the quantum tunnelling composite to provide a direct current path through the quantum tunnelling composite to the reciprocal apparatus.

In some examples the conductivity of the quantum tunnelling composite in the compressed state may be anisotropic such that the quantum tunnelling composite provides a direct current path in a direction in which the quantum tunnelling composite has been compressed but does not provide a direct current path in a direction in which the quantum tunnelling composite has not been compressed.

In some examples the magnetic portion may be configured to move between a first position and a second position wherein when the magnetic portion is in the first position the quantum tunnelling composite is in a non-compressed state and when the magnetic portion is in the second position the quantum tunnelling composite is in a compressed state.

In some examples the apparatus may further comprise a cavity configured to enable the magnetic portion to move between the first position and the second position.

In some examples the quantum tunnelling composite may form part of a casing of the apparatus.

In some examples the quantum tunnelling composite may be water resistant.

In some examples the apparatus may comprise a recess within a casing where the recess is configured to receive the reciprocal apparatus and enable the apparatus to be coupled to the reciprocal apparatus.

In some examples the apparatus may comprise a projection within a casing where the projection is configured to fit into a recess of a reciprocal apparatus and enable the apparatus to be coupled to the reciprocal apparatus.

In some examples the apparatus may comprise at least one contact electrically connected to the quantum tunnelling composite.

In some examples the apparatus may comprise an insulating material around the at least one contact.

In some examples the insulating material may comprise a part of a casing of the apparatus.

In some examples the magnetic portion may comprise a magnet.

In some examples the magnetic portion may comprise a portion which is attracted to a magnet.

In some examples there may be provided an electronic device comprising an apparatus as described above.

In some examples there may be provided a connecting device comprising an apparatus as described above.

According to various, but not necessarily all, examples of the disclosure, there may be provided a method comprising: providing a layer of quantum tunnelling composite within an apparatus where the quantum tunnelling composite is configured such that in a non-compressed state the quantum tunnelling composite is an electrical insulator and in a compressed state the layer of quantum tunnelling composite is an electrical conductor; configuring a magnetic portion to cause compression of the quantum tunnelling composite; and enabling the apparatus to be coupled to a reciprocal apparatus where the reciprocal apparatus comprises a reciprocal magnetic portion such that when the apparatus is coupled to the reciprocal apparatus the magnetic portion causes compression of the quantum tunnelling composite to provide a direct current path through the quantum tunnelling composite to the reciprocal apparatus.

In some examples the conductivity of the quantum tunnelling composite in the compressed state may be anisotropic such that the quantum tunnelling composite provides a direct current path in a direction in which the quantum tunnelling composite has been compressed but does not provide a direct current path in a direction in which the quantum tunnelling composite has not been compressed.

In some examples the magnetic portion may be configured to move between a first position and a second position wherein when the magnetic portion is in the first position the quantum tunnelling composite is in a non-compressed state and when the magnetic portion is in the second position the quantum tunnelling composite is in a compressed state.

In some examples the method may further comprise providing a cavity configured to enable the magnetic portion to move between the first position and the second position.

In some examples the quantum tunnelling composite may form part of a casing of the apparatus.

In some examples the quantum tunnelling composite may be water resistant.

In some examples the method may comprise providing a recess within a casing where the recess is configured to receive the reciprocal apparatus and enable the apparatus to be coupled to the reciprocal apparatus.

In some examples the method may comprise providing a projection within a casing where the projection is configured to fit into a recess of a reciprocal apparatus and enable the apparatus to be coupled to the reciprocal apparatus.

In some examples the method may comprise providing at least one contact electrically connected to the quantum tunnelling composite.

In some examples the method may comprise providing an insulating material around the at least one contact.

In some examples the insulating material may comprise a part of a casing of the apparatus In some examples the magnetic portion may comprise a magnet.

In some examples the magnetic portion may comprise a portion which is attracted to a magnet.

According to various, but not necessarily all, examples of the disclosure there is provided examples as claimed in the appended claims.

BRIEF DESCRIPTION

Figure 2:
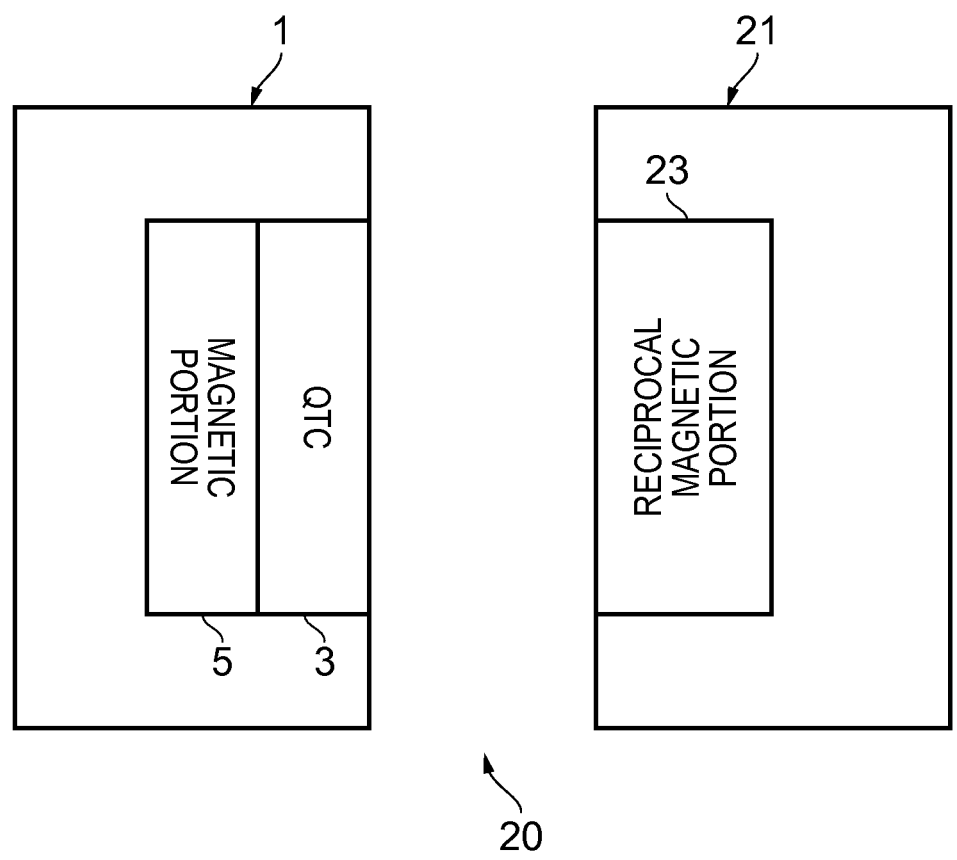
Figure 3:
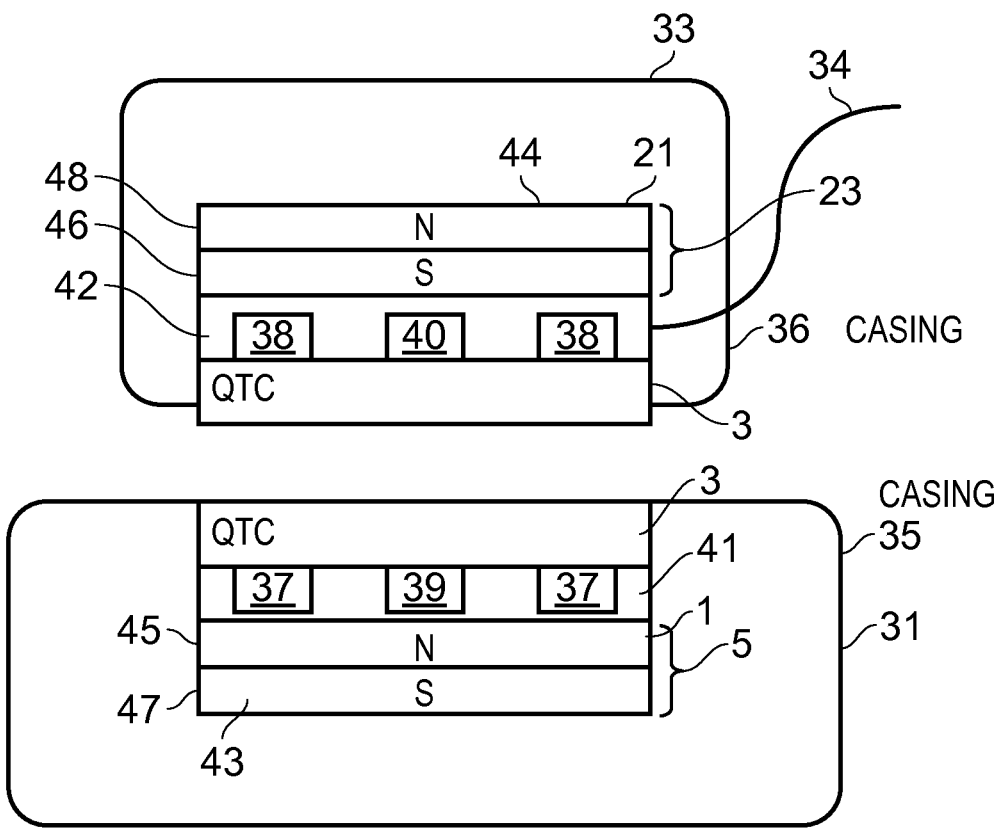
Figure 4:
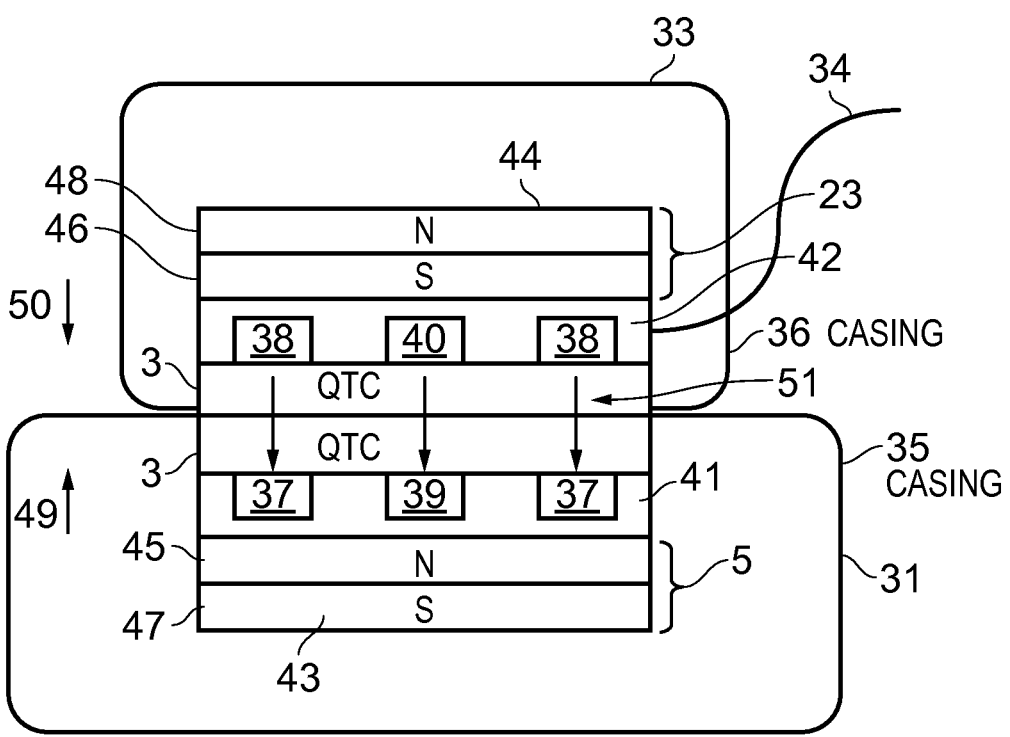
Figure 5A:
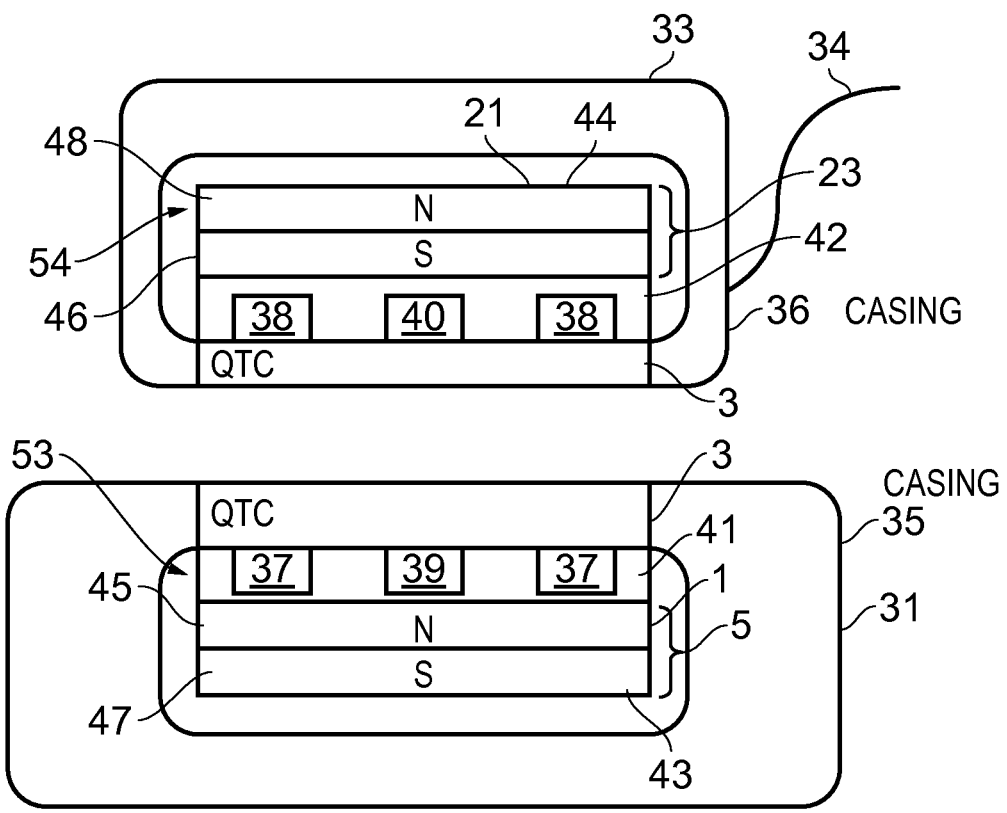
Figure 5B:
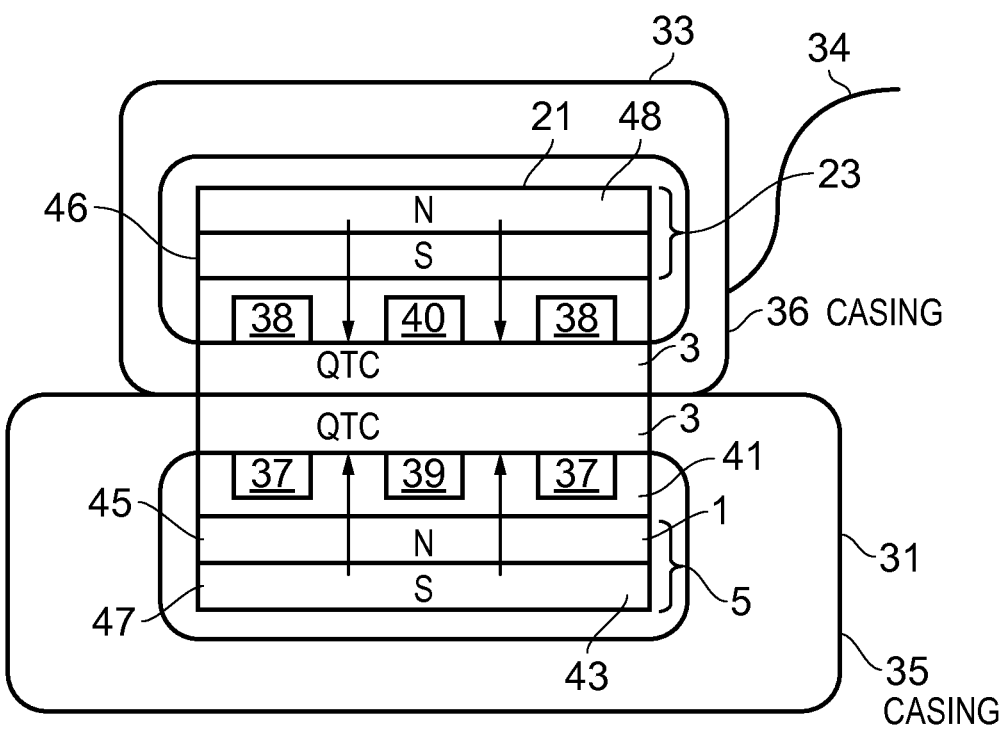
Figure 6A:
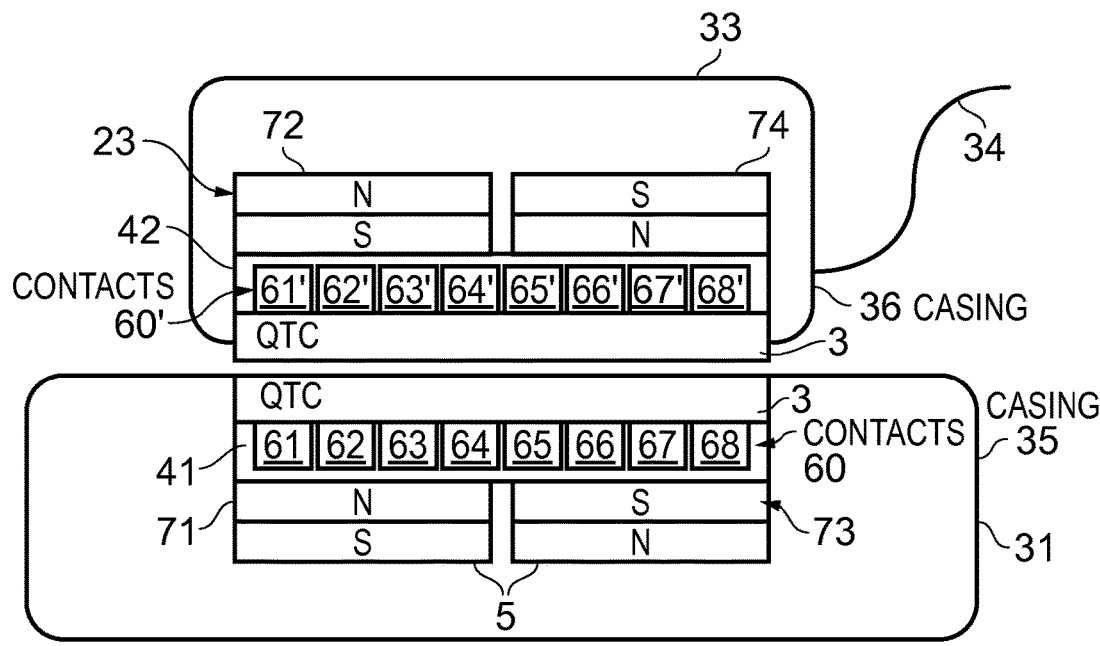
Figure 6B:
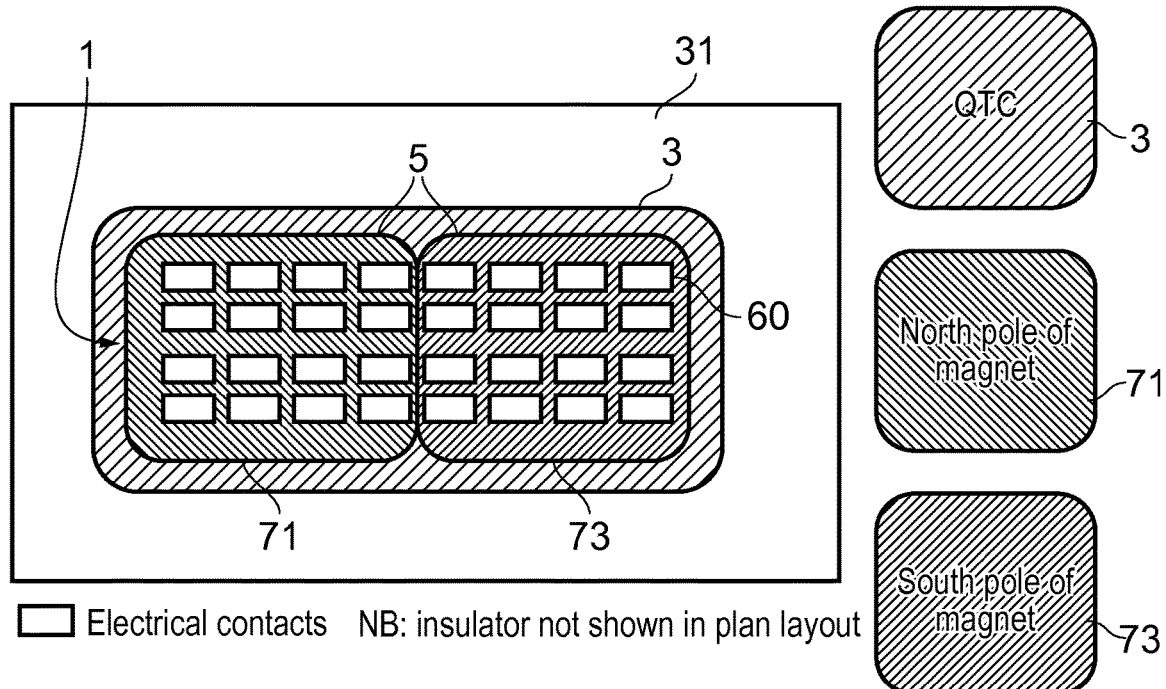
Figure 7A:
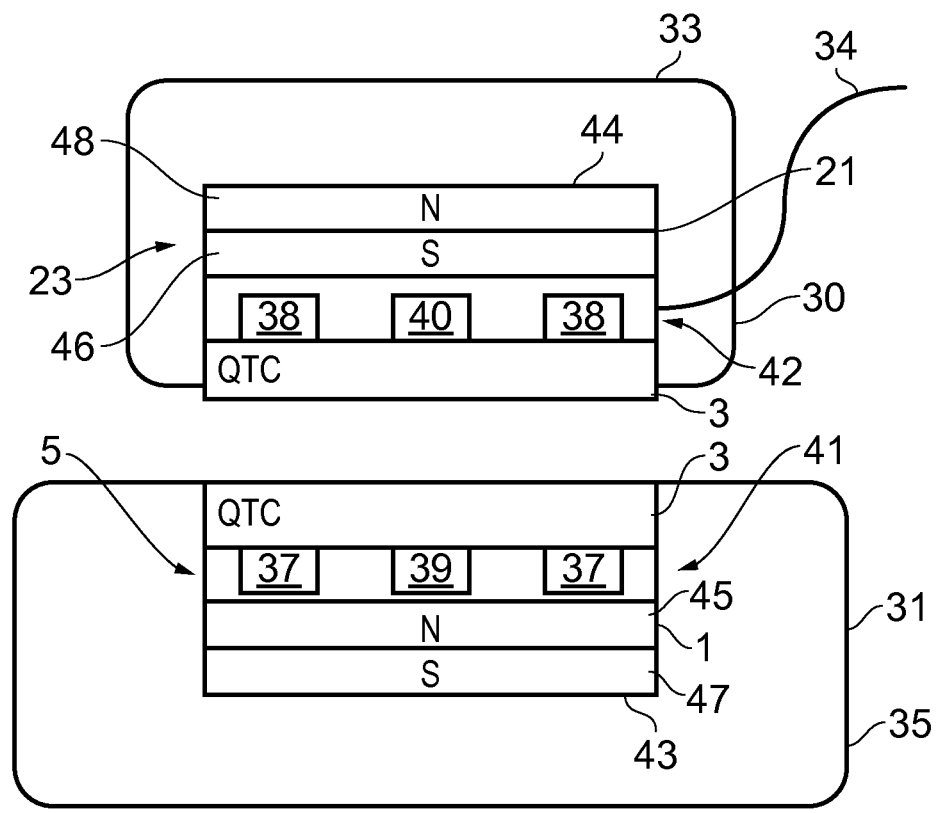
Figure 7B:
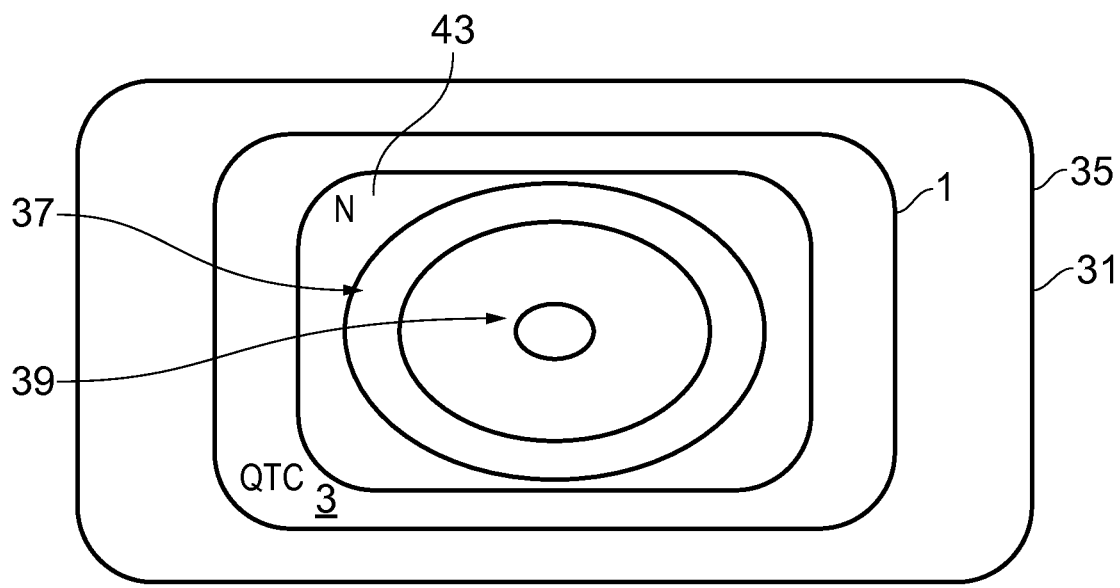
Figure 8:
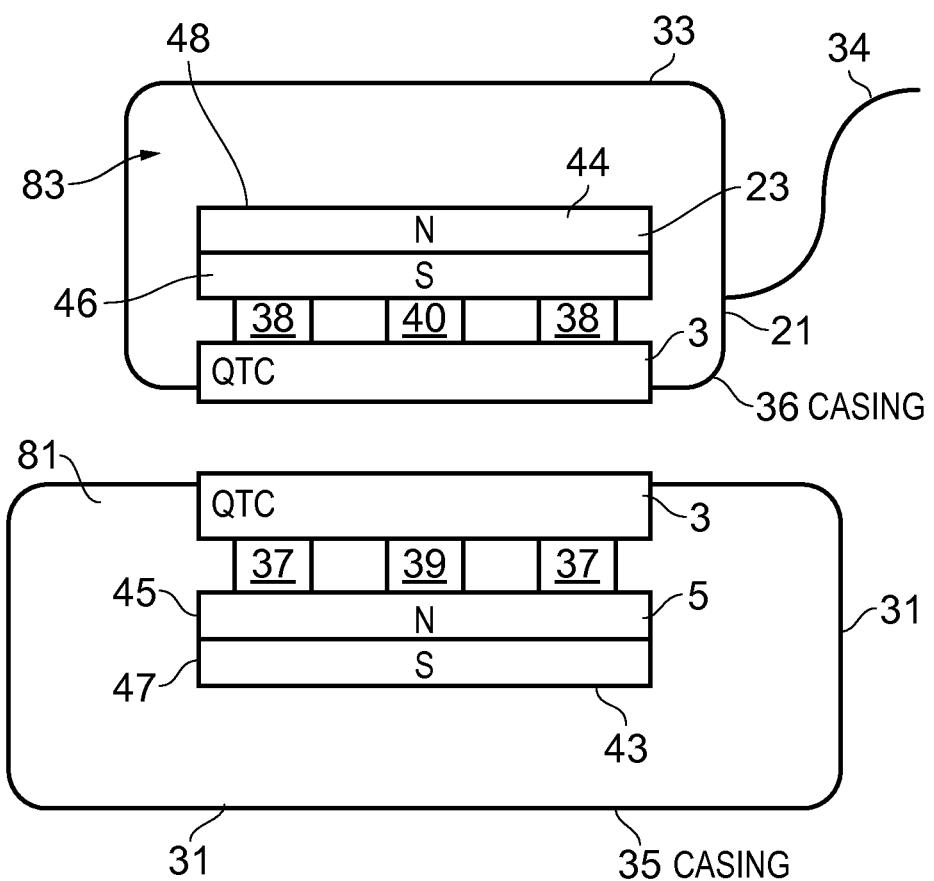
Figure 9:
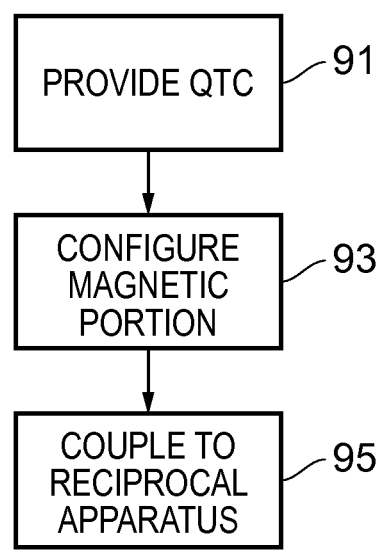

For a better understanding of various examples that are useful for understanding the detailed description, reference will now be made by way of example only to the accompanying drawings in which:

FIG. 1 illustrates an apparatus;
FIG. 2 illustrates a system;
FIG. 3 illustrates devices comprising example apparatus;
FIG. 4 illustrates devices comprising example apparatus;
FIGS. 5A and 5B illustrate devices comprising example apparatus;
FIGS. 6A and 6B illustrate devices comprising example apparatus;
FIGS. 7A and 7B illustrate devices comprising example apparatus;
FIG. 8 illustrates example devices; and
FIG. 9 illustrates an example method.

DETAILED DESCRIPTION

The Figures illustrate apparatus 1 and methods. The apparatus 1 comprises: a layer of quantum tunnelling composite 3 configured such that in a non-compressed state the quantum tunnelling composite 3 is an electrical insulator and in a compressed state the layer of quantum tunnelling composite 3 is an electrical conductor; a magnetic portion 5 configured to cause compression of the quantum tunnelling composite 3; and wherein the apparatus 1 is configured to be coupled to a reciprocal apparatus 21 where the reciprocal apparatus 21 comprises a reciprocal magnetic portion 23 such that when the apparatus 1 is coupled to the reciprocal apparatus 21 the magnetic portion 5 causes compression of the quantum tunnelling composite 3 to provide a direct current path through the quantum tunnelling composite 3 to the reciprocal apparatus 21.

The apparatus 1 may be provided within an electronic device 31 or connecting device 33. The apparatus 1 may enable the electronic device 31 to be coupled to the connecting device 33. The connecting device 33 may enable a power source or peripheral device or any other suitable device to be coupled to the electronic device 31. The connecting device 33 may enable transfer of power and/or data between the electronic device 31 and the power source or peripheral device or other suitable device.

FIG. 1 schematically illustrates an apparatus 1 according to examples of the disclosure. The apparatus 1 comprises a layer of quantum tunnelling composite (QTC) 3 and a magnetic portion 5.

The QTC 3 may comprise means for increasing electronic conductivity in response to being compressed. The QTC 3 may be arranged so that in a non-compressed state the QTC 3 is an electrical insulator. In the non-compressed state there is no direct current path through the QTC 3. In a compressed state the layer of QTC 3 is an electrical conductor. In the compressed state there is a direct current path through the QTC 3.

The QTC 3 may comprise conductive portions, such as metals, dispersed within an insulating binder. When the QTC 3 is in a non-compressed state the conductive portions are too far apart to enable direct current to flow through the QTC 3. When the QTC 3 is in a compressed state the conductive portions are moved closer to each other so that electrons can tunnel though the insulating binder and provide a path for direct current.

The conductivity of the QTC 3 may change exponentially in response to the compression of the QTC 3 because the quantum tunnelling effect is exponentially dependent upon the distance between the conductive portions. In some cases the conductivity of the QTC 3 may change by a factor of up to $10^{12}$ between a non-compressed state and a compressed state.

The conductivity of the QTC 3 in the compressed state may be anisotropic. If the QTC 3 is only compressed in one direction then the distance between the conductive portions of the QTC 3 will only decrease in the direction of the compression. This enables the QTC 3 to be arranged such that the QTC 3 provides a direct current path in a direction in which the QTC 3 has been compressed but does not provide a direct current path in a direction in which the QTC 3 has not been compressed.

The QTC 3 may be provided in a thin layer. In some examples the layer of QTC 3 may be between 100 micrometers and 5 mm thick. The thin layer of QTC 3 only requires a small space within an apparatus 1 or electronic device 31.

The magnetic portion 5 may comprise means for compressing the QTC 3. The magnetic portion 5 may comprise any portion which may be configured to move in response to a magnetic field and/or cause another magnetic portion 5 to move in response to a magnetic field provided by the magnetic portion 5.

In some examples the magnetic portion 5 may comprise one or more magnets. In some examples the magnetic portion 5 may comprise a portion of a magnetic material which may be attracted to one or more magnets. The magnetic material may comprise any magnetic material such as iron or nickel or any other suitable material.

The magnetic portion 5 may be configured to move between a first position and a second position. When the magnetic portion 5 is in the first position the QTC 3 may be in a non-compressed state. As the magnetic portion 5 moves to the second position the QTC 3 is compressed so that when the magnetic portion 5 is in the second position the QTC 3 is in a compressed state.

In other examples the magnetic portion 5 may be fixed in position within the apparatus 1 but may be arranged to cause movement of a reciprocal magnetic portion 23 in a reciprocal apparatus 21. In such examples the movement of the reciprocal magnetic portion 23 may cause compression of the QTC 3.

The apparatus 1 is configured to be coupled to a reciprocal apparatus 21. FIG. 2 illustrates an example system 20 comprising an apparatus 1 and reciprocal apparatus 21. The apparatus 1 may be as described above in relation to FIG. 1. Corresponding reference numerals are used for corresponding features.

The apparatus 1 may comprise means which enables the apparatus 1 to be coupled to the reciprocal apparatus 21. In some examples the magnetic fields of the respective magnetic portions 5, 23 may be sufficient to couple the apparatus 1 and the reciprocal apparatus 21 together. In other examples the apparatus 1 may comprise a cavity which may be configured to receive a corresponding projection on the reciprocal apparatus 21 to hold the two apparatus 1, 21 together. In some examples the reciprocal apparatus 21 may comprise a cavity which may be configured to receive a corresponding projection on the apparatus 1 to hold the two apparatus 1, 21 together.

In the example system 20 the apparatus 1 comprises a layer of QTC 3 and a magnetic portion 5. The reciprocal apparatus 21 comprises a reciprocal magnetic portion 23. The reciprocal magnetic portion 23 may comprise any means which may interact with the magnetic portion 5 of the apparatus 1 to compress the QTC 3. In some examples the reciprocal magnetic portion 23 may comprise a magnet which provides a magnetic field which causes the magnetic portion 5 of the apparatus 1 to move between a first position and a second position. In some examples the reciprocal magnetic portion 23 may comprise a magnetic material which may be moved by a magnetic field provided by the magnetic portion 5 of the apparatus 1. In some examples both the magnetic portion 5 and the reciprocal magnetic portion 23 may be configured to move to cause compression of the QTC 3. In other examples only one of the magnetic portion 5 or the reciprocal magnetic portion 23 may be configured to move and compress the QTC 3.

When the magnetic portions 5, 23 cause compression of the QTC 3 this increases the conductivity of the QTC 3 in the direction in which the QTC 3 has been compressed. This increase in conductivity may provide a direct current path between the apparatus 1 and the reciprocal apparatus 21 through the layer of QTC 3. The direct current path may enable the transfer of data and/or power between the apparatus 1 and the reciprocal apparatus 21.

It is to be appreciated that FIGS. 1 and 2 schematically illustrate example apparatus 1 and reciprocal apparatus 21 and that other components may be provided within the apparatus 1 and reciprocal apparatus 21 which are not illustrated in FIGS. 1 and 2. For instance the apparatus 1 and the reciprocal apparatus 21 may comprise one or more contacts. In the example of FIG. 2 only the apparatus 1 comprises a layer of QTC 3. In some examples both the apparatus 1 and the reciprocal apparatus 21 may comprise a layer of QTC 3.

The apparatus 1 and reciprocal apparatus 21 may be provided within electronic devices 31 and or/or connecting devices 33. FIG. 3 schematically illustrates cross sections of an electronic device 31 and a connecting device 33. In FIG. 3 the electronic device 31 comprises an apparatus 1 and the connecting device 33 comprises a reciprocal apparatus 21. It is to be appreciated that in other examples the electronic device 31 may comprise the reciprocal apparatus 21 and the connecting device 33 could comprise the apparatus 1.

The electronic device 31 may comprise any user electronic device 31. In some examples the electronic device 31 may be a portable electronic device 31 such as a mobile telephone, laptop computer, camera or any other device which is intended to be carried by a user. In other examples the electronic device 31 need not be portable. For instance the electronic device 31 could comprise a television or computer or other suitable appliance.

The electronic device 31 comprises a casing 35. The casing 35 may provide any means which may house the components of the electronic device 31. The casing 35 may house the apparatus 1 and other electronic components. For instance, where the electronic device 31 comprises a mobile telephone the casing 35 may house the electronic components such as the printed wiring board, antenna, audio transducers and other suitable components. The casing 35 may protect the electronic components from the ingress of fluid, dust and/or other contaminants. The casing 35 may be made of plastic or any other suitable material.

The casing 35 may provide an outer surface of the electronic device 31. The casing 35 may be configured so that the user can see and/or touch the casing 35 when the electronic device 31 is in use.

The example apparatus 1 provided within the electronic device 31 comprises a layer of QTC 3 and a magnetic portion 5 which may be as described above. Corresponding reference numerals are used for corresponding features. The apparatus 1 also comprises a plurality of contacts 37, 39.

In the example of FIG. 3 the apparatus 1 is positioned within the electronic device 31 so that the QTC 3 forms part of the casing 35 of the electronic device 31. In the example of FIG. 3 the QTC 3 is level with the surface of the casing 35 so that the casing 35 and the QTC 3 form a continuous level surface. In the example of FIG. 3 the QTC 3 is in a non-compressed state so that the QTC 3 forms an electrically insulating part of the casing 35.

The material that is selected for use as the QTC 3 may be water resistant to prevent the ingress of water into the casing 35.

In some examples the QTC 3 may be a different colour to the rest of the casing 35. This may enable a user to locate the apparatus 1 even when the QTC 3 is level with the surface of the casing 35.

In the example of FIG. 3 the apparatus 1 comprises a plurality of contacts 37, 39. The plurality of contacts 37, 39 may be electrically connected to the QTC 3. The contacts 37, 39 may comprise any means which enables the QTC 3 to be connected to electronic components within the electronic device 31. The contacts 37, 39 may form a conductive path or part of conductive path between the other electronic components within the electronic device 31 and the QTC 3.

The contacts 37, 39 may comprise any suitable conductive materials. The contacts may comprise copper, gold, silver or any other suitable conductive material.

The contacts 37, 39 are positioned adjacent to the layer of QTC 3. The contacts 37, 39 may be positioned in direct contact with the QTC 3 to enable a direct current path to be provided from the contacts 37, 39 to the QTC 3.

In some examples the contacts 37, 39 may be provided on a printed wiring boards or flexible printed circuit board. The QTC 3 may be bonded to the printed wiring board or flexible printed circuit board to ensure good electrical connection is established between the contacts 37, 39 and the QTC 3. An adhesive or any other suitable means may be used to bond the QTC 3 to the printed wiring board of flexible circuit board. Alternatively the QTC 3 could be moulded or cast onto the printed wiring board or flexible circuit board.

In some examples the contacts 37, 39 could be provided on the QTC 3 itself rather than on a printed wiring board or flexible circuit board. In such examples the contacts 37, 39 could be printed or deposited on the QTC 3. Any suitable techniques could be used to provide the contacts 37, 39 on the QTC 3 such as inkjet printing, screen printing, gravure printing, thermal evaporation, sputtering or any other suitable technique. In other examples the contacts 37, 39 could be adhered to the QTC 3 using a conductive adhesive. In such examples the conductive adhesive may be deposited on to the QTC 3 in a pattern corresponding to the contacts 37, 39.

In the example of FIG. 3 the contacts 37, 39 are illustrated adjacent to the QTC 3. In some examples the contacts 37, 39 could be physically embedded within the QTC 3. In such examples the QTC 3 could be moulded or cast over the contacts 37, 39.

In the example of FIG. 3 two contacts 37, 39 are provided in a coaxial arrangement. An insulating material 41 is provided between the contacts 37, 39 to prevent a short circuit between the contacts 37, 39. The insulating material 41 may comprise any material which prevents flow of direct current flow between the contacts 37, 39.

In the example of FIG. 3 the magnetic portion 5 of the apparatus 1 comprises a magnet 43. The magnet 43 is arranged with the north pole 45 directed towards the QTC 3 and the south pole 47 directed away from the QTC 3.

In the example of FIG. 3 the electrical insulator 41 is provided between magnet 43 and the contacts 37, 39. This prevents direct current flow between the magnet 43 and the contacts 37, 39.

In the examples of FIG. 3 the connecting device 33 may comprise a plug. The plug 33 may comprise any means which may enable a power source and/or peripheral device to be connected to the electronic device 31. It is to be appreciated that other types of connecting device 33 could be used in other examples. For instance the connecting device 33 could be a power supply, a data carrier a connection to a peripheral device or any other suitable device.

In the example of FIG. 3 the connecting device 33 comprises a reciprocal apparatus 21. The connecting device 33 also comprises a plurality of contacts 38, 40 and a casing 36.

The layer of QTC 3 within the reciprocal apparatus 21 may be as described above in relation to the apparatus 1. The material that is used for the QTC 3 within the apparatus 1 may be the same as the material that is used for the QTC 3 within the reciprocal apparatus 21.

In the example of FIG. 3 the layer of QTC 3 projects out of the casing 36. This may enable the layer of QTC 3 to be compressed when the electronic device 31 and the connecting device 33 are coupled together.

The casing 36 may house the contacts 38, 40 and the reciprocal magnetic portion 23 and any other suitable components.

The plurality of contacts 38, 40 may be electrically connected to the QTC 3. The contacts 38, 40 may comprise any means which enables the QTC 3 to be connected to electronic components within the connecting device 33. In the example of FIG. 3 the contacts 38, 40 may enable an electrical connection between a cable 34 and the QTC 3. The cable 34 may enable connection to a peripheral device.

In the example of FIG. 3 two contacts 38, 40 are provided within the connecting device 33. The two contacts 38, 40 are provided in a coaxial arrangement which corresponds to the coaxial arrangement of the contacts 37, 39 within the electronic device 31 (FIGS. 7A and 7B also show a device with the contacts 38, 40 in a coaxial arrangement). The contacts 38, 40 may be arranged in a corresponding arrangement to the contacts 37, 39 within the electronic device 31 such that when the electronic device 31 and the connecting device 33 are coupled together the contacts 38, 40 of the connecting device 33 are aligned with the contacts 37, 39 of the electronic device 31. The alignment of the contacts 37, 39 may provide a direct current path between the contacts 37, 39, 38 40.

An insulating material 42 may be provided between the contacts 38, 40 to prevent a short circuit between the contacts 37, 39. The insulating material may be the same or similar to the insulating material 41 within the electronic device 31.

In the example of FIG. 3 the magnetic portion 23 of the reciprocal apparatus 21 comprises a magnet 44. The magnet 44 is arranged with the south pole 46 directed towards the QTC 3 and the north pole 48 directed away from the QTC 3. The magnet 44 is arranged so that when the connecting device 33 is positioned close to the electronic device 31 the magnet 44 of the connecting device 33 is attracted towards the magnet 43 of the electronic device 31.

FIG. 4 illustrates the electronic device 31 and the connecting device 33 coupled together. The arrangement of the magnets 43, 44 in the apparatus 1 and reciprocal apparatus 21 creates an attractive force between the magnets 43, 44 when the apparatus 1 and the reciprocal apparatus 21 are positioned close to each other. This attractive force may cause movement of one or both of the magnets 43, 44 as indicated by the arrows 49, 50. In the example of FIG. 4 the magnet 43 of the electronic device 31 moves towards the connecting device 33 as indicated by the arrow 49. The magnet 44 of the connecting device 33 moves towards the electronic device 31 as indicated by the arrow 50.

In some examples the movement of the magnets 43, 44 may compress the layers of QTC 3 so that the QTC 3 does not project out of the casing 36 of the connecting device 33 when the electronic device 31 is coupled to the connecting device 33.

The movement of the magnets 43, 44 causes compression of the layers of the QTC 3. When the QTC 3 is compressed it switches from an insulator to a conductor. As the contacts 37, 39, 38, 40 are positioned in alignment with each other, the compressed QTC 3 provides a direct current 51 path between the contacts 37, 39 in the electronic device 31 and the contacts 38, 40 in the connecting device 33.

The direct current path 51 enables a connection to be provided between the contacts 37, 39 of the electronic device 31 and the contacts 39, 40 of the connecting device 33. This may enable power transfer and/or data transfer between the devices 31, 33.

As the QTC 3 is only compressed in one direction the direct current path 51 is only provided in one direction. The QTC 3 remains electrically insulating in the direction in which it has not been compressed. In the example of FIG. 4 the QTC 3 is not compressed in the direction parallel to the surfaces of the casings 35, 36. This prevents any current flowing in this direction. This prevents a short circuit being created between contacts 37, 39, 38, 40 within the same device 31, 33.

When the electronic device 31 is removed from the connecting device 33 the magnets 43, 44 are no longer attracted to each other. The magnets 43, 44 move back to their original positions within the apparatus 1 and reciprocal apparatus 21 so that the QTC 3 returns to the non-compressed insulating state as illustrated in FIG. 3.

FIGS. 5A and 5B schematically illustrate a cross section through another example electronic device 31 and example connecting device 33. The electronic device 31 may comprise an apparatus 1 as described above and the connecting device 33 may comprise a reciprocal device 21 as described above. Corresponding reference numerals are used for corresponding features. FIG. 5A illustrates the electronic device 31 and the connecting device 33 disconnected from each other and FIG. 5B illustrates the electronic device 31 and the connecting device 33 connected together.

In the example of FIGS. 5A and 5B the electronic device 31 comprises a cavity 53 and the connecting device 33 also comprises a cavity 54. The cavities 53 54 may enable the magnets 43, 44 to move within the bodies of the electronic device 31 and the connecting device 33.

When the electronic device 31 and the connecting device 33 are disconnected, as illustrated in FIG. 5A the QTC 3 is in a non-compressed state and is level with the surface of the casings 35, 36 so that the casing 35, 36 and the layers of QTC 3 form a continuous level surface. In the example of FIG. 5A neither the electronic device 31 nor the connecting device 33 require the QTC 3 to project from the surface of the casing 35, 36. This enables smooth outer surfaces to be provided for both the electronic device 31 and the connecting device 33.

When the electronic device 31 and the connecting device 31 are coupled together the magnets 43, 44 may move within the cavities 53, 54. The movement within the cavities 53, 54 may enable the layers of QTC 3 to be compressed and the direct current paths 51 to be established as described above.

FIGS. 6A and 6B schematically illustrate another example electronic device 31 and example connecting device 33. FIG. 6A illustrates a cross section through an electronic device 31 and a connecting device 33 and FIG. 6B schematically illustrates a plan view of an electronic device 31.

In the example of FIGS. 6A and 6B the electronic device 31 comprises thirty two contacts 60. The contacts 60 are arranged in four rows of eight as shown in the plan view of FIG. 6B. In the cross section of FIG. 6A eight contacts 61-68 are shown. It is to be appreciated that any number of contacts 60 in any suitable arrangement may be provided in other examples of the disclosure.

The connecting device 33 also comprises thirty two corresponding contacts 60'. The corresponding contacts 60' may be arranged in a corresponding arrangement to the contacts 60 within the electronic device 31 such that when the electronic device 31 and the connecting device 33 are coupled together the contacts 60' of the connecting device 33 are aligned with the contacts 60 of the electronic device 31. The alignment of the contacts 60, 60' may provide a direct current path 51 between the contacts 60, 60'.

The respective magnetic portions 5, 23 are arranged so that the connecting device 33 can only be coupled to the electronic device 31 with the contacts 60, 60' in the correct orientation. This may be achieved by using a plurality of magnets which are arranged with the north and south poles in alternating orientations.

In the example of FIGS. 6A and 6B the magnetic portion 5 of the electronic device 31 comprises a first magnet 71 and a second magnet 73. The first magnet 71 is provided on the left hand side of the apparatus 1. The first magnet 71 is provided on the left hand side of the apparatus 1 so that it overlays the left hand side of the array of contacts 60. The second magnet 73 is provided adjacent to the first magnet 71. The second magnet 73 is provided on the right hand side of the apparatus 1. The second magnet 73 is provided on the right hand side of the apparatus 1 so that it overlays the right hand side of the array of contacts 60.

The first and second magnets 71, 73 are arranged so that different poles are directed towards to the QTC 3. In the example of FIGS. 6A and 6B the first magnet 71 is arranged so that the north pole is directed towards the QTC 3 and the second magnet 73 is arranged so that the south pole is directed towards the QTC 3.

The magnetic portion 23 of the connecting device 33 also comprises a first magnet 72 and a second magnet 74. The first magnet 72 is provided on the left hand side of the reciprocal apparatus 21. The first magnet 72 is provided on the left hand side of the reciprocal apparatus 21 so that it overlays the left hand side of the array of contacts 60'. The second magnet 74 is provided adjacent to the first magnet 72. The second magnet 74 is provided on the right hand side of the reciprocal apparatus 21. The second magnet 74 is provided on the right hand side of the reciprocal apparatus 21 so that it overlays the right hand side of the array of contacts 60'.

The first and second magnets 72, 74 of the connecting device 33 are arranged so that different poles are directed towards to the QTC 3. In the example of FIGS. 6A and 6B the first magnet 72 is arranged so that the south pole is directed towards the QTC 3 and the second magnet 74 is arranged so that the north pole is directed towards the QTC 3.

This arrangement of the magnetic portions 5, 23 ensures that if the connecting device 33 is positioned in the correct orientation, as illustrated in FIG. 6A the magnets 71, 72 and 73, 74 will be attracted to each other and compress the layers of QTC 3 as described above. If the connecting device 33 is positioned in an incorrect orientation, for instance, if it was orientated with the first magnet 72 on the right hand side and the second magnet 74 on the left hand side, then the magnets 71, 74 and 73, 72 would repel each other and there would be no compression of the layers of QTC 3.

FIGS. 7A and 7B schematically illustrate another example electronic device 31 and example connecting device 33. FIG. 7A illustrates a cross section through an electronic device 31 and a connecting device 33 and FIG. 7B schematically illustrates a plan view of an electronic device 31.

In the example of FIGS. 7A and 7B the electronic device 31 comprises two coaxial contacts 37, 39. The first contact 37 may comprise an annular contact and the second contact 39 may be located on the axis of the first contact 37. The coaxial contacts may be circular so that the contacts 37, 39 have rotational symmetry.

The connecting device 33 also comprises two corresponding coaxial contacts 38, 40. The corresponding contacts 38, 40 may be arranged in a corresponding arrangement to the contacts 37, 39 within the electronic device 31 such that when the electronic device 31 and the connecting device 33 are coupled together the contacts 38, 40 of the connecting device 33 are aligned with the contacts 37, 39 of the electronic device 31. The alignment of the contacts 37, 38, 39, 40 may provide a direct current path between the contacts 37, 38, 39, 40.

As the coaxial contacts have rotational symmetry the magnetic portions 5, 23 of the apparatus 1 and the reciprocal apparatus 21 may be arranged to be attracted towards each other in any orientation of the connecting device 33. In the examples of FIGS. 7A and 7B the magnetic portion 5 of the apparatus 1 within the electronic device 31 comprises a single magnet 43 with the north pole 45 facing towards the layer of QTC 3. The magnetic portion 23 of the reciprocal apparatus 21 within the connecting device 33 also comprises a single magnet 44. The magnet 44 has the south pole 46 directed towards the QTC 3 to ensure that the two magnets 43, 44 are attracted towards each other when the connecting device 33 is positioned close to the electronic device 31.

FIG. 8 illustrates another example electronic device 31 and connecting device 33. In the example of FIG. 8 the contacts 37, 39, 38, 40 are provided embedded within the casing 35, 36. In these examples the casing 35, 36 provides an insulating material 81, 83 between the contacts 37, 39, 38, 40 and prevents short circuits between the contacts 37, 39, 38, 40.

In the example of FIG. 8 the magnetic portions 5, 23 are fixed in position within the respective apparatus 1, 21. As the contacts 37, 39, 38, 40 are embedded within the casing 35, 36 the magnetic portion 5, 23 do not move relative to the contacts 37, 39, 38, 40 and the casing 35, 36. In these examples at least one or the layers of QTC 3 projects from the surface of the casing 35, 36 so that when the apparatus 1 and reciprocal apparatus 21 are coupled together the QTC 3 is compressed.

FIG. 9 illustrates an example method. The method may be used to provide example apparatus 1 as described above. The method comprises, at block 91, providing a layer of QTC 3 within an apparatus 1. The QTC 3 is configured such that in a non-compressed state the QTC 3 is an electrical insulator and in a compressed state the layer of QTC 3 is an electrical conductor.

The method also comprises, at block 93, configuring a magnetic portion 5 to cause compression of the QTC 3.

The method also comprises, at block 95, enabling the apparatus 1 to be coupled to a reciprocal apparatus 21 where the reciprocal apparatus 21 comprises a reciprocal magnetic portion 23 such that when the apparatus 1 is coupled to the reciprocal apparatus 23 the magnetic portion 5 causes compression of the QTC 3 to provide a direct current path 51 through the QTC 3 to the reciprocal apparatus 21.

Examples of the disclosure may be used to enable electronic devices 31 to be coupled to other devices.

In some examples the apparatus 1 may enable electronic devices 31 to be connected without requiring an aperture to be provided within the casing 35 of the electronic device 31. This may enable the electronic devices 31 to be waterproof and may improve protection from dust and other contaminants. This may also improve the design freedom of the casing 35 of the electronic device 31 as there is no requirement to provide an aperture or projection within the casing 35. This may also improve the aesthetics of the electronic device 31 as it enables a smooth and/or seamless casing to be provided.

The use of the QTC 3 provides a connection that is only conductive when the magnetic portion 23 of the connecting device 33 is coupled to the electronic device 31. This provides an insulating outer casing 35 when the two devices 31, 33 are not connected. It may also prevent incorrect connecting devices being coupled to the electronic device 31 and may prevent the connecting devices 33 from being connected in an incorrect orientation.

In the above description the term "coupled" means operationally coupled. Any number of intervening components may be provided including no intervening components.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed. For instance, in the examples described above each apparatus 1 and reciprocal apparatus 21 only comprises a single layer of QTC 3. In other examples a plurality of different layers of QTC 3 may be provided. The different layers of QTC 3 may be coupled to different electrical contacts.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
   a layer of quantum tunnelling composite comprising conductive portions separated by a compressible binder and configured such that in a non-compressed state the quantum tunnelling composite is an electrical insulator and in a compressed state the layer of quantum tunnelling composite is an electrical conductor;
   at least one contact electrically connected to the quantum tunnelling composite;
   a magnetic portion configured to cause deformation of the quantum tunnelling composite;
   an insulator material positioned around a portion of the at least one contact and between the quantum tunnelling composite and the magnetic portion; and
   wherein the apparatus is configured to be coupled to a reciprocal apparatus comprising a cavity, the cavity configured to enable the magnetic portion to move between a first position and a second position, where the reciprocal apparatus comprises a reciprocal magnetic portion such that when the apparatus is coupled to the reciprocal apparatus and the quantum tunnelling composite is deformed, the quantum tunnelling composite is compressed to provide a direct current path through the quantum tunnelling composite to the reciprocal apparatus;
   wherein when the magnetic portion is in the first position the quantum tunnelling composite is in a non-compressed state and when the magnetic portion is in the second position the quantum tunnelling composite is in a compressed state.

2. An apparatus as claimed in claim 1 wherein the conductivity of the quantum tunnelling composite in the compressed state is anisotropic such that the quantum tunnelling composite provides a direct current path in a direction in which the quantum tunnelling composite has been compressed but does not provide a direct current path in a direction in which the quantum tunnelling composite has not been compressed.

3. An apparatus as claimed in claim 1 wherein the quantum tunnelling composite forms part of a casing of the apparatus.

4. An apparatus as claimed in claim 1 wherein the quantum tunnelling composite is water resistant.

5. An apparatus as claimed in claim 1 wherein the apparatus comprises a recess within a casing where the recess is configured to receive the reciprocal apparatus and enable the apparatus to be coupled to the reciprocal apparatus.

6. An apparatus as claimed in claim 1 wherein the apparatus comprises a projection within a casing where the projection is configured to fit into a recess of a reciprocal apparatus and enable the apparatus to be coupled to the reciprocal apparatus.

7. An apparatus as claimed in claim 1 wherein the insulating material comprises a part of a casing of the apparatus.

8. An apparatus as claimed in claim 1 wherein the magnetic portion comprises at least one of; a magnet, a portion which is attracted to a magnet.

9. An electronic device comprising an apparatus as claimed in claim 1.

10. A connecting device comprising an apparatus as claimed in claim 1.

11. A method comprising:
providing a layer of quantum tunnelling composite within an apparatus where the quantum tunnelling composite comprises conductive portions separated by a compressible binder and is configured such that in a non-compressed state the quantum tunnelling composite is an electrical insulator and in a compressed state the layer of quantum tunnelling composite is an electrical conductor;
providing at least one contact electrically connected to the quantum tunnelling composite;
configuring a magnetic portion to cause deformation of the quantum tunnelling composite;
providing an insulator material around a portion of the at least one contact and between the quantum tunnelling composite and the magnetic portion; and
enabling the apparatus to be coupled to a reciprocal apparatus, the reciprocal apparatus comprising a cavity configured to enable the magnetic portion to move between a first position and a second position, where the reciprocal apparatus comprises a reciprocal magnetic portion such that when the apparatus is coupled to the reciprocal apparatus and the magnetic portion causes deformation of the quantum tunnelling composite, the quantum tunnelling composite is compressed to provide a direct current path through the quantum tunnelling composite to the reciprocal apparatus;
wherein when the magnetic portion is in the first position the quantum tunnelling composite is in a non-compressed state and when the magnetic portion is in the second position the quantum tunnelling composite is in a compressed state.

12. A method as claimed in claim 11 wherein the conductivity of the quantum tunnelling composite in the compressed state is anisotropic such that the quantum tunnelling composite provides a direct current path in a direction in which the quantum tunnelling composite has been compressed but does not provide a direct current path in a direction in which the quantum tunnelling composite has not been compressed.

13. A method as claimed in claim 11 wherein the quantum tunnelling composite forms part of a casing of the apparatus.

14. A method as claimed in claim 11 wherein the quantum tunnelling composite is water resistant.

* * * * *